United States Patent
Shi et al.

(10) Patent No.: US 7,218,007 B2
(45) Date of Patent: May 15, 2007

(54) UNDERFILL MATERIAL TO REDUCE BALL LIMITING METALLURGY DELAMINATION AND CRACKING POTENTIAL IN SEMICONDUCTOR DEVICES

(75) Inventors: Song-Hua Shi, Phoenix, AZ (US);
Tian-An Chen, Phoenix, AZ (US);
Jason Zhang, Gilbert, AZ (US);
Katrina Certeza, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 10/950,691

(22) Filed: Sep. 28, 2004

(65) Prior Publication Data

US 2006/0071337 A1  Apr. 6, 2006

(51) Int. Cl.
*H01L 23/52* (2006.01)
*H01L 23/48* (2006.01)
*H01L 29/40* (2006.01)

(52) U.S. Cl. ............................. 257/778; 257/E21.503; 257/678; 257/753; 257/783; 528/53; 525/528; 525/452

(58) Field of Classification Search ........ 257/E21.503, 257/678, 753, 687, 789, 795, 778, 783; 528/53; 525/528, 452; 428/114, 260, 327, 403–407; 442/59, 70; 361/746; 174/148, 258
See application file for complete search history.

(56) References Cited

U.S. PATENT DOCUMENTS

| | | | | |
|---|---|---|---|---|
| 3,613,613 A | * | 10/1971 | Loritz et al. ................ | 215/328 |
| 5,340,781 A | * | 8/1994 | Oda et al. .................... | 501/127 |
| 5,567,792 A | * | 10/1996 | Muroi et al. .................. | 528/53 |
| 5,629,566 A | * | 5/1997 | Doi et al. .................... | 257/789 |
| 5,677,045 A | * | 10/1997 | Nagai et al. ................. | 442/294 |
| 5,855,821 A | * | 1/1999 | Chau et al. .................. | 252/514 |
| 5,930,597 A | * | 7/1999 | Call et al. .................... | 438/106 |
| 5,998,861 A | * | 12/1999 | Hiruta ........................ | 257/700 |
| 6,121,689 A | * | 9/2000 | Capote et al. .............. | 257/783 |
| 6,132,646 A | * | 10/2000 | Zhou et al. ................. | 252/512 |
| 6,297,564 B1 | * | 10/2001 | Chung ........................ | 257/783 |
| 6,326,241 B1 | * | 12/2001 | Belke et al. ................. | 438/118 |
| 6,376,160 B1 | * | 4/2002 | Wang et al. ................. | 430/350 |
| 6,774,493 B2 | * | 8/2004 | Capote et al. .............. | 257/778 |
| 6,784,555 B2 | * | 8/2004 | Watson ....................... | 257/783 |
| 6,943,058 B2 | * | 9/2005 | Chaudhuri et al. ......... | 438/108 |

\* cited by examiner

*Primary Examiner*—Kenneth Parker
*Assistant Examiner*—Chris C. Chu
(74) *Attorney, Agent, or Firm*—Pearl Cohen Zedek Latzer LLP

(57) ABSTRACT

An electronic structure includes an electronic device coupled to a substrate by conductive bumps and ball limiting metallurgy (BLM). Underfill material having filler particles is disposed in a space between the electronic device and the substrate. A weight percentage of the filler particles is at least about 60%. A particle size of at least 90 wt % of the filler particles is less than about 2 μm and/or the filler particles are coated by an organic coupling agent. Once the underfill material is fully cured, its coefficient of thermal expansion is no more than 30 PPM/° C., and its glass transition temperature is at least 100° C., and its adhesion to a passivation layer of the electronic device, to the substrate and to the electronic device at its edges is such that the electronic structure passes standardized reliability tests without delamination of the ball limiting metallurgy.

21 Claims, 2 Drawing Sheets

UNDERFILL MATERIAL TO REDUCE BALL LIMITING METALLURGY DELAMINATION AND CRACKING POTENTIAL IN SEMICONDUCTOR DEVICES

BACKGROUND OF THE INVENTION

Flip chip microelectronic assembly is the direct electrical connection of face-down (hence "flipped") electronic devices onto substrates by way of conductive bumps on the chip bond pads. The electronic devices are typically semiconductor devices, but may be passive filters, detector arrays, and microelectromechanical system (MEMS) devices. Flip chip is also known as Direct Chip Attach (DCA), since the chip is directly attached to the substrate by the conductive bumps.

The conductive bumps may be attached to the electronic device by ball limiting metallurgy (BLM), also known as under bump metallurgy (UBM) and pad limiting metallurgy (PLM).

Once the electronic device is attached to the substrate, mechanical strains may occur that, over time, result in damage to the conductive bumps and/or to the BLM and/or to a passivation layer of the electronic device.

A non-conductive underfill material introduced to the space between the electronic device and the substrate may protect the bumps from moisture or other environmental hazards, may provide additional mechanical strength to the electronic structure, and may compensate for any thermal expansion differences between the chip and the substrate.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

Figure 1:
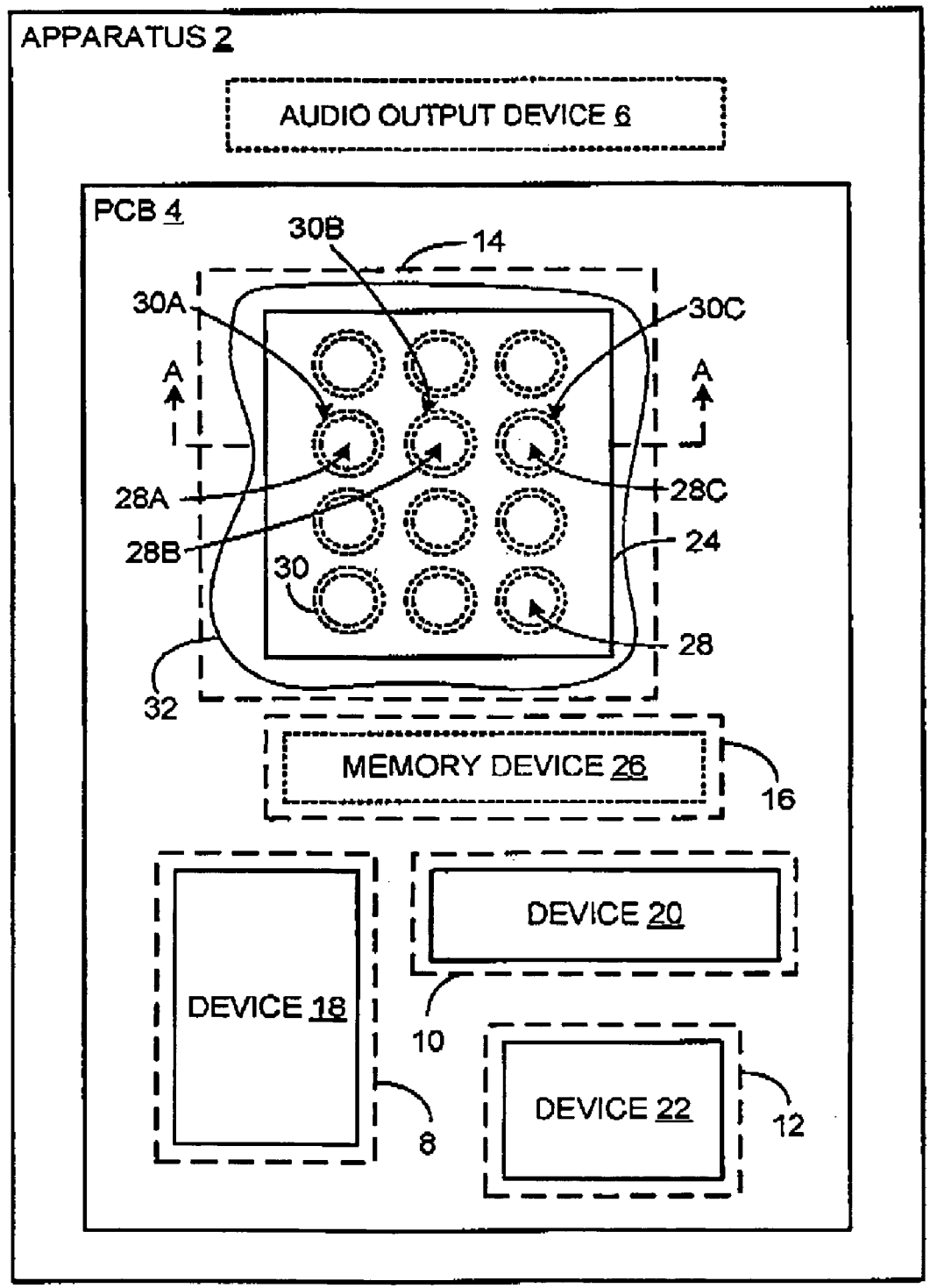
FIG. 1 is a top view of an exemplary apparatus including an exemplary printed circuit board, the exemplary printed circuit board is having devices installed thereon, in accordance with some embodiments of the invention.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

According to some embodiments of the invention, an electronic device, such as a semiconductor device, may contain one or more semiconductor dies, may contain at least one passivation layer, and may contain conductive bumps (e.g. solder-balls) in a ball grid array (BGA) arrangement or in any other suitable arrangement. Any, or all, of the bumps may serve as external electrical and/or mechanical terminations of the semiconductor device.

The following description refers to semiconductor devices, but embodiments of the invention are equally applicable to electronic devices such as passive filters, detector arrays and microelectromechanical system (MEMS) devices, and the like.

The following description refers to solder bumps, but embodiments of the invention are equally applicable to other types of bumps, including plated bumps, stud bumps, adhesive bumps, non-solder metal alloy bumps and the like.

The following description refers to flip chips, but embodiments of the invention are equally applicable to other types of devices, including ball grid array (BGA) devices, chip scale package (CSP) devices, and the like.

A semiconductor die may have patterns of metal conductors formed therein for internal signal traces, and at least some of the metal conductors may include ball bonding pads, to be mechanically and electrically coupled to bumps. BLM may be mechanically and electrically coupled to at least some of the ball bonding pads, and may be mechanically and electrically coupled to corresponding bumps.

A substrate such as a printed circuit board (PCB) may include pads, that may, or may not, include a pre-solder, and the semiconductor device may be soldered to the pads in a soldering process such as, for example, a reflow process. During the soldering process, the bumps may become mechanically and/or electrically attached to the pads. In the description below, the mechanical structure formed by a ball bonding pad, the corresponding BLM and bump, and a PCB pad that is soldered to the bump, is denoted an "interconnection joint".

During the soldering process, the bumps may melt and may change their form, and the semiconductor device will sink due to its own weight. Mechanical strains, that may, or may not, be uniform, may develop at the interconnection joints along the semiconductor die and may affect the bumps and/or the BLM and/or the ball bonding pads and/or the silicon die and/or the passivation layer.

The PCB, having the semiconductor device installed thereon, may be included as a part of an apparatus that may be operated using electrical currents. While the apparatus is operating and electrical currents flow through the semiconductor device, temperatures at the interconnection joints and along the semiconductor device may vary, and as a result, additional mechanical strains may develop at the interconnection joints.

It may be appreciated that mechanical strains that may affect the semiconductor die and the interconnection joints may develop as a result of additional reasons that are not specified here.

The mechanical strains may result in damages to interconnection joints and/or to the passivation layer or to the semiconductor die. For example, cracks may develop in the passivation layer and/or BLM may be delaminated. Such damage may, for example, degrade the functionality of the semiconductor device and may degrade functionality of the apparatus.

After the semiconductor device is soldered to the PCB, a non-conductive underfill material may be introduced in a gap formed between the semiconductor device and the PCB. The underfill material may be cured, and may become solid. Once cured, the solid underfill material may become glued to surfaces that it is in contact with. For example, the solid underfill material may become glued to the PCB, to bumps, to BLM and to the semiconductor device.

Mechanical strains that are developed locally at different interconnection joints and at different parts of the semiconductor device may be re-distributed by the underfill material along the semiconductor device. Consequently, the semiconductor device and the interconnection joints may withstand mechanical strains, for example, due to temperature changes, better than the case where an underfill material is not introduced.

Mechanical structures of semiconductor devices may be of different kinds, and materials used for manufacturing semiconductor devices may be of different kinds. For example, materials used to construct the BLM, the bumps and the passivation layer may vary between semiconductor devices. In addition, the size of the bumps and the pitch between the bumps may vary between semiconductor devices.

With different combinations of materials and mechanical structures, some parts of the semiconductor device may be more prone to damage than others due to mechanical strains. For example, with some combinations of materials and mechanical structures, a passivation layer of a semiconductor device may be prone to develop cracks before other parts of the semiconductor device become damaged. In another example, with some other combinations of materials and mechanical structures, the BLM may be prone to become delaminated before other parts of the semiconductor device become damaged.

FIG. 1 shows an exemplary apparatus 2 in accordance to some embodiments of the invention. Apparatus 2 may include an electronic structure, such as a printed circuit board (PCB) 4, for example a motherboard, and may optionally include an audio output device 6. A non-exhaustive list of examples for apparatus 2 includes a personal computer (PC), a notepad computer, a notebook computer, a laptop computer, a server computer, a pocket PC, a personal digital assistant (PDA), a personal information manager (PIM), a cellphone, a pager, a mobile or non-mobile memory storage device, a hard disk drive (HDD), a floppy disk drive (FDD), a monitor, a projector, a digital video disc (DVD) player, a video compact disc (VCD) player, an MP3 player, a mobile media player, a calculator, a wireless mobile station, a wireless base station, and the like.

PCB 4 may include, for example, "footprints" 8, 10, 12, 14, and 16 for respective electronic devices. PCB 4 may have installed thereon some devices. For example, electronic devices 18, 20, 22 and 24 may be installed on footprints 8, 10, 12 and 14, respectively, and a memory device 26 may optionally be installed on footprint 16. Mechanical features of PCB 4, such as, for example, additional footprints, traces, through holes, and mechanical features of footprints 8, 10, 12, and 16 and of electronic devices 18, 20, 22 and 26 are not shown for clarity.

A non-exhaustive list of examples for memory device 26 includes a) a removable memory device, such as a compact flash (CF) memory card, a personal computer memory card international association (PCMCIA) memory card, a security identity module (SIM) card, a MEMORY STICK® device, a universal serial bus (USB) KEY® memory device, and the like, b) a semiconductor device, such as a read only memory (ROM) device, a mask ROM device, an electrically erasable programmable read only memory device (EE-PROM), a non-volatile random access memory device (NVRAM), a not AND (NAND) flash memory device, a not OR (NOR) flash memory device, a synchronous dynamic random access memory (SDRAM) device, a RAMBUS® dynamic random access memory (RDRAM) device, a double data rate (DDR) memory device, a static random access memory (SRAM) device, and the like, Electronic device 24 may contain one or more semiconductor dies and may contain bumps 28, located on or partially embedded in a bottom surface of electronic device 24, and electrically coupled to at least one of the semiconductor dies. Bumps 28 may have diameters in the range of, for example, 20 µm to 200 µm, and pitch between bumps 28 may be in the range of, for example, 50 µm to 300 µm.

A non-exhaustive list of exemplary materials from which bumps 28 may be constructed includes leaded materials, such as, for example, tin-lead (SnPb), tin-lead-silver (SnPbAg), lead free materials, such as, for example, tin-silver (SnAg), tin-silver-copper (SnAgCu), or any other suitable eutectic soft soldering conducting material.

Footprint 14 may comprise pads 30 suitable to be soldered to respective bumps 28, and at least some of pads 30 may be soldered to respective bumps 28. PCB 4 may comprise physical traces and/or embedded vias (not shown) for any or all of pads 30.

In addition, a non-conductive underfill material 32, in accordance to some embodiments of the invention, may be present around device 24 and in a gap between PCB 4 and a bottom surface of device 24.

For clarity, device 24 is shown as comprising twelve bumps 28 arranged in an array of three columns and four rows. It may be appreciated that this is an example only, and any number and any arrangement of bumps 28 located on or partially embedded in the bottom surface of device 24 is possible. In addition, for clarity of the drawing, bump 28 and pads 30 are shown as having a round shape and pads 30 are shown as having a larger diameter than bump 28. It should be understood that any other shapes of bump 28 and pads 30, and any other size proportions between bump 28 and pads 30 are possible, and are under the scope of the invention Reference is now made to FIG. 2, which is an exemplary simplified cross-sectional view of PCB 4, semiconductor device 24, bumps 28A, 28B and 28C, PCB pads 30A, 30B and 30C and underfill material 32, along cross-section A that is shown in FIG. 1. In exemplary FIG. 2, semiconductor device 24 is a flip chip device, although it should be understood that it is merely an example, and device 24 may be of another kind.

Figure 2:
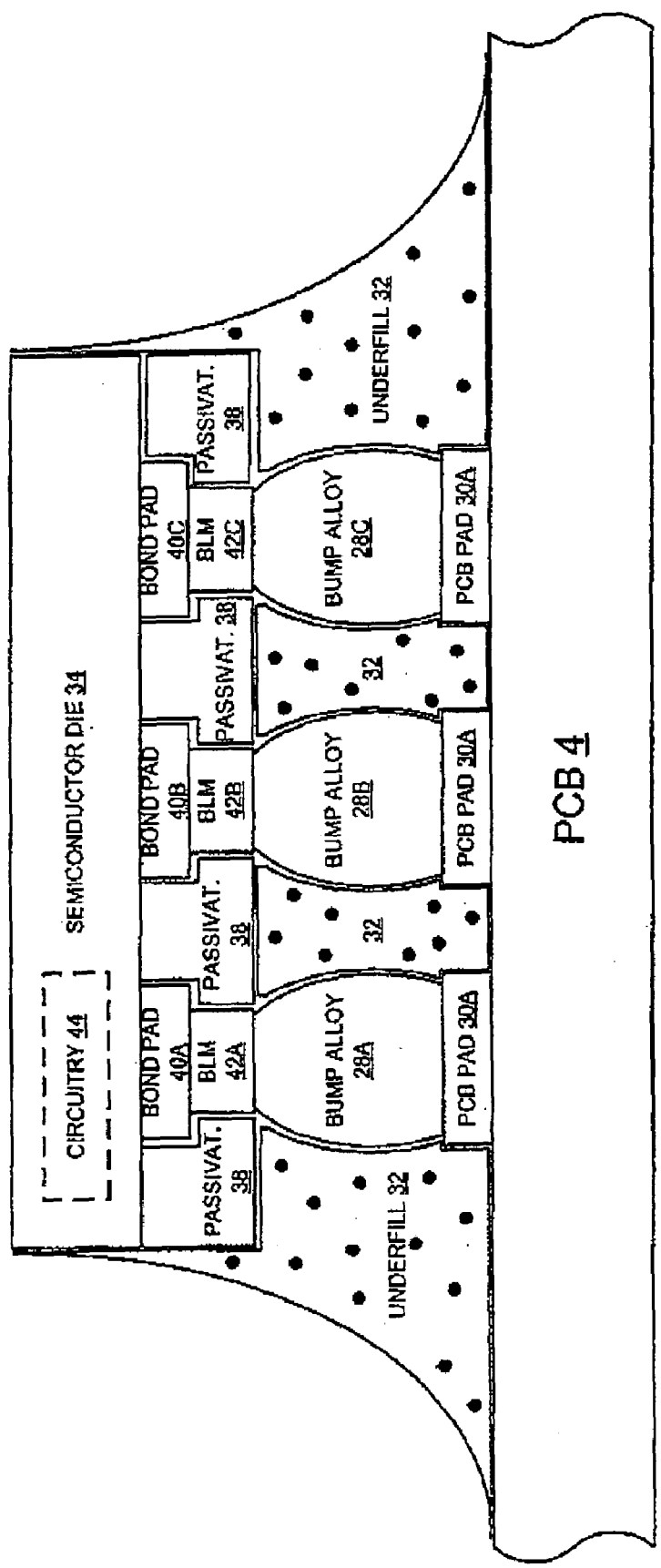
FIG. 2 is an exemplary simplified cross-sectional view of a printed circuit board and of a flip chip device installed thereon, in accordance with some embodiments of the invention.

FIG. 2 shows components of semiconductor device 24 that are not shown in FIG. 1, namely, a semiconductor die 34, a passivation layer 38, bond pads 40A, 40B and 40C, and ball limiting materials (BLM) 42A, 42B and 42C.

Bond pads 40A, 40B and 40C may be parts of an external metal layer (not shown) of semiconductor die 34. BLM 42A, 42B and 42C may be mechanically and electrically coupled to bond pads 40A, 40B and 40C, respectively, and to bumps 28A, 28B and 28C, respectively, and may serve as mechanical interfaces between semiconductor die 34 and the bumps.

Although in bumps 28 are shown as having a spherical shape, this is an example only, and any shape is possible. Moreover, the shape of bumps 28 may change during soldering of semiconductor device 24 to PCB 4.

Semiconductor die 34 may comprise circuitry 44. A non-exhaustive list of exemplary functionality that circuitry 44 implements includes a processor, a graphical processor, a peripheral component interconnect (PCI) north bridge, a PCI south bridge, a communication processor, a memory controller, a wireless local area network (LAN) controller, a radio frequency (RF) controller, a video processor and the like. Moreover, semiconductor device 24 may be, for example, an application specific integrated circuit (ASIC), an application specific standard product (ASSP), a field programmable gate array (FPGA), and the like.

Underfill material 32 may include filler particles. The adhesion of underfill material 32 to die passivation layer 38, PCB 4 and semiconductor die 34 at die edges may enable semiconductor device 24 installed on PCB 4 to pass tests defined in JEDEC standard "JEP 148" entitled "Reliability Qualification of Semiconductor Devices Based on Physics of Failure and Risk and Opportunity Assessment" published April 2004 by the JEDEC Solid State Technology Association.

In some embodiments, an example of quality and reliability requirements for a specific application is passing 500 thermal cycles under the condition B test of the JEDEC standard "JESD22-A104-B" entitled "Temperature Cycling" published July 2000, and passing 75 hours of Highly Accelerated Stress Test (HAST) condition A of the JEDEC standard "JESD22-A118" entitled "Accelerated Moisture Resistance—Unbiased HAST" published December 2000, without any delamination of the BLM.

In other embodiments, an example of quality and reliability requirements for a specific application is passing 750 thermal cycles under the condition B test (JESD22-A104-B) and passing 100 hours of HAST condition A (JESD22-A118) without any delamination of the BLM.

A weight percentage of the filler particles in underfill material 32 may be at least about 60% in some embodiments, or at least about 65% in other embodiments. A particle size of at least 90 wt % of the filler particles may be less than about 2 μm in some embodiments or 1 μm in other embodiments. The filler particles may be coated by an organic coupling agent, in some embodiments. The filler particles may be silica filler particles, in some embodiments. The filler particles may be Alumina or other metal oxide particles in other embodiments. A non-exhaustive list of examples for the organic coupling agent includes a silane coupling agent, a titanate coupling agent, and an aluminate coupling agent.

A coefficient of thermal expansion of underfill material 32, once fully cured, may be no more than 30PPM/° C. in some embodiments, or no more than 25 PPM/° C. in other embodiments.

In some embodiments, if underfill material 32 is exposed to a temperature of up to 110° C. for no more than 5 minutes, viscosity of the underfill material may increase by no more than 20%. In other embodiments, if underfill material 32 is exposed to a temperature of up to 120° C. for no more than 5 minutes, viscosity of the underfill material may increase by no more than 20%.

Cross-linking density of underfill material 32 may become at least 50% or underfill material 32 may not flow, if underfill material 32 is exposed to a temperature below 180° C. for at least 20 minutes, in some embodiments, or below 180° C. for at least 5 minutes, in other embodiments, or below 150° C. for at least 20 minutes, in other embodiments, or below 150° C. for at least 5 minutes, in other embodiments.

Underfill material 32 may become fully cured if exposed to a temperature below 180° C. for less than 3 hours, in some embodiments, or if exposed to a temperature below 150° C. for less than 1 hour, in other embodiments.

A glass transition temperature of underfill material 32, once fully cured, may be at least 100° C., in some embodiments, or at least 130° C., in other embodiments.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An underfill material for use with a semiconductor die device coupled to a substrate by conductive bumps and ball limiting metallurgy, said underfill material comprising:
   filler particles,
   wherein a weight percentage of said filler particles in said underfill material is at least about 60%,
   wherein a particle size of at least 90wt % of said filler particles is less than about 2 μm or said filler particles are coated by an organic coupling agent,
   wherein a coefficient of thermal expansion of said underfill material, once fully cured, is no more than 30PPM/° C.,
   wherein if said underfill material is exposed to a temperature of up to 110° C. for no more than 5 minutes, viscosity of said underfill material increases by no more than 20%,
   wherein if said underfill material is exposed to a temperature below 180° C. for at least 20 minutes, cross-linking density of said underfill material becomes at least 50% or said underfill material does not flow,
   wherein said underfill material becomes fully cured if exposed to a temperature below 180° C. for less than 3 hours, and
   wherein a glass transition temperature of said underfill material, once fully cured, is at least 100° C.

2. The underfill material of claim 1, wherein said weight percentage of said filler particles in said underfill material is at least about 65%.

3. The underfill material of claim 1, wherein a particle size of at least 90wt % of said filler particles is less than about 1 μm.

4. The underfill material of claim 1, wherein said filler particles are silica filler particles.

5. The underfill material of claim 4, wherein said silica filler particles are coated by an organic coupling agent, and said organic coupling agent is a silane coupling agent.

6. The underfill material of claim 4, wherein said silica filler particles are coated by an organic coupling agent, and said organic coupling agent is a titanate coupling agent.

7. The underfill material of claim 4, wherein said silica filler particles are coated by an organic coupling agent, and said organic coupling agent is an aluminate coupling agent.

8. The underfill material of claim 1, wherein said filler particles are metal oxide particles.

9. The underfill material of claim 1, wherein said coefficient of thermal expansion of said underfill material once fully cured is no more than 25 PPM/° C.

10. The underfill material of claim 1, wherein if said underfill material is exposed to a temperature of up to 40° C. for no more than 12 hours, viscosity of said underfill material increases by no more than 50%.

11. The underfill material of claim 1, wherein if said underfill material is exposed to a temperature of up to 60° C. for no more than 12 hours, viscosity of said underfill material increases by no more than 50%.

12. The underfill material of claim 1, wherein if said underfill material is exposed to a temperature of up to 120° C. for no more than 5 minutes, viscosity of said underfill material increases by no more than 20%.

13. The underfill material of claim 1, wherein said cross-linking density of said underfill material becomes at least 50% if said underfill material is exposed to a temperature below 180° C. for at least 5 minutes.

14. The underfill material of claim 1, wherein said underfill material does not flow if said underfill material is exposed to a temperature below 180° C. for at least 5 minutes.

15. The underfill material of claim 1, wherein said cross-linking density of said underfill material becomes at least 50% if said underfill material is exposed to a temperature below 150° C. for at least 20 minutes.

16. The underfill material of claim 1, wherein said underfill material does not flow if said underfill material is exposed to a temperature below 150° C. for at least 20 minutes.

17. The underfill material of claim 1, wherein said cross-linking density of said underfill material becomes at least 50% if said underfill material is exposed to a temperature below 150° C. for at least 5 minutes.

18. The underfill material of claim 1, wherein said underfill material does not flow if said underfill material is exposed to a temperature below 150° C. for at least 5 minutes.

19. The underfill material of claim 1, wherein said underfill material becomes fully cured if exposed to a temperature below 150° C. for less than 1 hour.

20. The underfill material of claim 1, wherein said glass transition temperature of said underfill material, once fully cured, is at least 130° C.

21. The underfill material of claim 1, wherein adhesion of said underfill material, once fully cured, to a) a passivation layer of an electronic device coupled to a substrate by conductive bumps and ball limiting metallurgy, b) said substrate and c) said electronic device at edges of said electronic device, is such that said coupled electronic device passes standardized reliability tests without delamination of said ball limiting metallurgy.

* * * * *